United States Patent [19]
Elvers et al.

[11] Patent Number: 5,242,500
[45] Date of Patent: Sep. 7, 1993

[54] APPARATUS FOR THE CONTINUOUS COATING OF BAND-TYPE SUBSTRATE

[75] Inventors: Bjoern Elvers, Hainburg; Klemens Ruebsam, Jossgrund; Jochen Heinz, Linden; Georg Harwarth, Alzenau; Ulrich Reibold, Wilhelmsfeld; Norbert Ross, Maintal; Helmut Grimm, Darmstadt, all of Fed. Rep. of Germany

[73] Assignee: Leybold Aktiengesellschaft, Hanau, Fed. Rep. of Germany

[21] Appl. No.: 885,079

[22] Filed: May 18, 1992

Related U.S. Application Data

[63] Continuation of Ser. No. 744,355, Aug. 13, 1991, abandoned, which is a continuation-in-part of Ser. No. 621,628, Dec. 4, 1990, abandoned.

[30] Foreign Application Priority Data

Aug. 27, 1990 [DE] Fed. Rep. of Germany ....... 4027034
Jun. 25, 1991 [DE] Fed. Rep. of Germany ....... 4120910

[51] Int. Cl.$^5$ .............................................. C23C 16/54
[52] U.S. Cl. .................................... 118/718; 118/726; 427/255.5
[58] Field of Search ................. 118/715, 718, 726, 50; 427/255.5

[56] References Cited

U.S. PATENT DOCUMENTS

| | | | |
|---|---|---|---|
| 4,325,986 | 4/1982 | Baren et al. | 118/718 |
| 4,532,888 | 8/1985 | Neumann et al. | 118/718 |
| 4,724,796 | 2/1988 | Ranke et al. | 118/726 |

FOREIGN PATENT DOCUMENTS

| | | |
|---|---|---|
| 970246 | 8/1958 | Fed. Rep. of Germany. |
| 3615487 | 11/1987 | Fed. Rep. of Germany. |
| 1-219157 | 9/1989 | Japan. |

*Primary Examiner*—Terry J. Owens
*Attorney, Agent, or Firm*—Felfe & Lynch

[57] ABSTRACT

An apparatus for the continuous coating of band-type substrates in a vacuum chamber comprises a plurality of evaporation vessels 1, 1', ... of the same size and configuration. These vessels form a row of evaporation vessels aligned with the direction of movement of the band and are spaced approximately equally apart. All vessels are made of an electrically conductive, ceramic material and can be heated by directly passing a current. Provision is made for a device for the continuous supply of wire to be evaporated to the evaporator vessels. The individual evaporator vessels 1, 1', ... of the row are offset with respect to one another. Together, they cover a small coating zone B which extends transversely to the direction of movement A of the band.

9 Claims, 3 Drawing Sheets

APPARATUS FOR THE CONTINUOUS COATING OF BAND-TYPE SUBSTRATE

This application is a continuation of U.S. application Ser. No. 07/774,355 filed Aug. 13, 1991, now abandoned, which is a continuation-in-part of U.S. application Ser. No. 07/621,628 filed Dec. 4, 1990, now abandoned.

BACKGROUND OF THE INVENTION

The invention relates to an apparatus for continuously coating band-type substrates in a vacuum coating chamber comprising a plurality of evaporator vessels. The latter form a row of evaporators disposed parallel to each other, spaced approximately equally apart and following the direction of movement of the band. All of the evaporator vessels are made of an electrically conductive ceramic material and are heated by directly passing through a current. Further comprised is a device for the continuous supply of wire to be evaporated to the evaporator vessels.

Prior art apparatus for the continuous coating of band-type substrates in a vacuum coating chamber where the evaporator vessels are disposed along the direction of movement of the band and spaced parallel to one another at equal distances.

Further, an apparatus is known (DE 970 246) which, in order to obtain a greatest possible uniform layer thickness on the substrate to be coated, has chambers which correspond to the evaporator vessels and are disposed in two or more parallel rows. These rows are offset with respect to each other in such a manner that, if looked at from the side, the chambers mutually overlap and thus do not allow an evaporation gap to form.

U.S. Pat. No. 3,563,202 discloses a large number of evaporating cells arranged transversely to the direction of band movement. The heating of the cells is individually controlled, and the cells are continuously moved and resupplied with source material. However, the cells are not suited for the evaporation of metals delivered in wire form.

JP-A-1-219 157 discloses electrically heated evaporating cells spaced apart at equal distances and parallel to the direction of band movement, but without any offset between centerlines of the cells.

These known devices have the disadvantage that the overlap of the evaporation beams of the individual sources causes an irregular coating distribution on the band. In an ideal case, this is a wave-like distribution with maximum and minimum values above and between the vessels. The best-possible layer uniformity is determined by the amplitude of maximum and minimum values. The amplitude itself depends upon the geometric arrangement and the characteristics of the emission (rate distribution) of the individual sources and upon the interaction between the individual sources.

It is possible that the above apparatus according to DE 970 246 improves the layer distribution. The disadvantage, however, is that it is no alternative for high rate coating with a conventional coating rate of greater than 1 $\mu$m/sec at a coating width of the band of 3 m, at a maximum, since 1. a continuous supply of wire is not possible and
2. technically, the supply of energy necessary for evaporating the wire is very difficult.

SUMMARY OF THE INVENTION

The object underlying the invention is therefore to reduce mutual interactions between the individual sources thus improving the present layer uniformity in order to achieve a substantially improved coating quality without extra costs.

This object is achieved in accordance with a first embodiment in that the individual evaporator vessels have centered cavities and the vessels of the evaporator row are disposed in an arrangement where they are offset with respect to one another. Together, all, cavities cover a narrow coating zone which extends transversely to the direction of movement of the band.

This offset arrangement brings about a reduction of the number of collisions of vapor atoms among each other (the free distance travelled by the vapor atoms is approximately 3 mm) and, hence, of the mutual interaction. This in turn advantageously produces a more flat, wave-like intensity distribution with maximum and minimum values above and between the vessels and thus an improved uniformity of the coating. According to a second embodiment, the individual evaporator vessels have offset cavities and the vessels are arranged in a straight row so that adjacent cavities are offset from each other, alternate cavities having common centerlines offset from the centerline of the row. Once again all cavities cover a narrow coating zone which extends transversely to the layer of the band.

The course of the layer can be determined by a model calculation. Due to an overlap of dot sources, the planar individual sources of the evaporator vessels correspond to a general intensity distribution proportional to $\cos^n \beta$ ($\beta$ = angle between the surface normal of the vessel and the local vector). At a coating rate of e.g. approximately 6 g/min, the measured distribution of the layer thickness of an individual source (e.g. the vessel dimensions being 10×30×150 mm and the cavity K being 25×90 mm) can be described by an intensity distribution with an exponent n=4. For the distribution of the layer thickness of an entire row of evaporators where the vessels are disposed in a parallel arrangement and spaced apart at a distance of X=95 mm, for example, the exponent increases to n=20. This is coupled to an increase of the amplitude between maximum and minimum values and, hence, a poorer layer uniformity.

DETAILED DESCRIPTION OF PREFERRED EMBODIMENT

Figure 1:
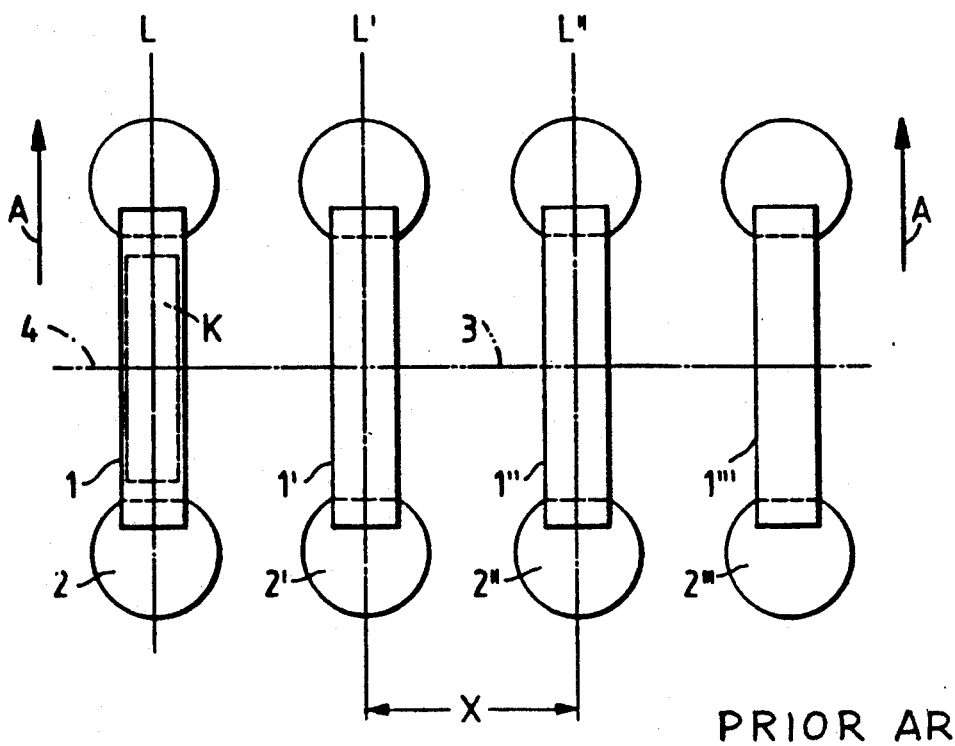
FIG. 1 is a diagrammatically represented top view, of evaporator vessels for Al-band coating as individual sources in a parallel arrangement as known in prior art.

As seen in FIG. 1, the rectangular evaporator vessels 1, 1', ... have also rectangular indentations on their surfaces which are subsequently referred to as cavity K. At their front sides, the vessels 1, 1', ... are held by almost circular clamping pieces 2, 2', ... and are arranged such that their longitudinal axes L, L', ... run parallel to one another each being spaced apart from the other at a defined distance X. The common transverse axis 3 of the individual evaporator vessel 1, 1', ... coincides with the center line 4 of all vessels 1, 1' ... and hence with the entire evaporator row. The band to be coated can be moved in direction of band movement A perpendicular to the center line 4 of the evaporator row and can be moved over the latter.

Figure 2:
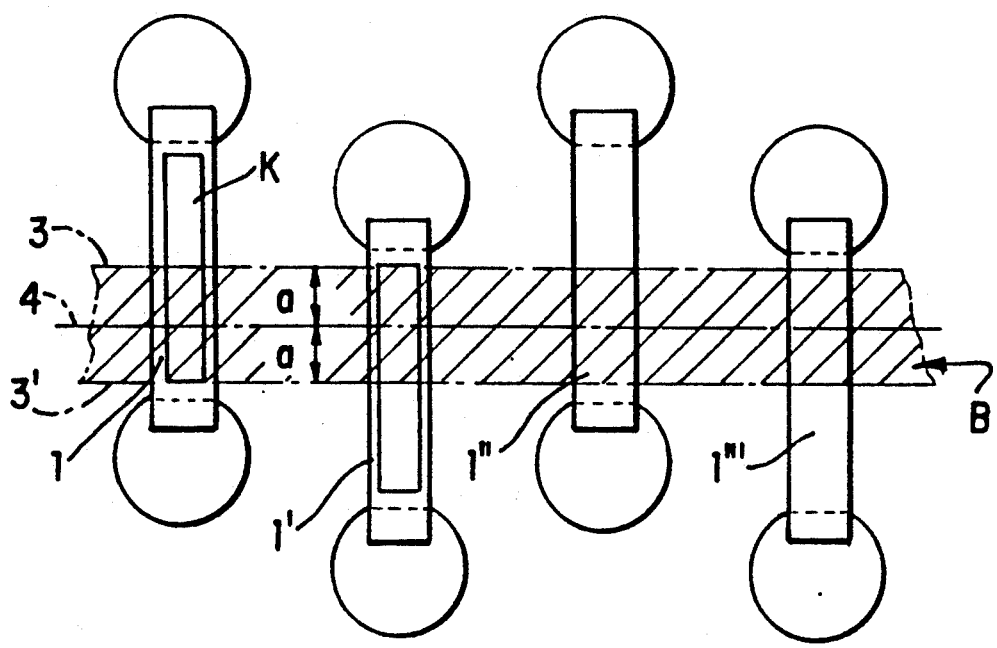
FIG. 2 is a diagrammatically represented top view of evaporator vessels for Al-band coating as individual sources in an offset arrangement in accordance with a first embodiment of the invention.

FIG. 2 is part of an evaporator row including four evaporator vessels 1, 1', ... similar to those of FIG. 1. FIG. 2 is distinguished from FIG. 1 in that, with their transverse axes 3, 3', the evaporator vessels 1, 1' are located on the center line 4 from which they are alternatingly offset at a distance a. Together, however, the cavities of all evaporator vessels 1, 1', ... cover a narrow coating zone B, represented in hatched lines, which extends transversely to the direction of movement A of the band.

Figures 3, 4:
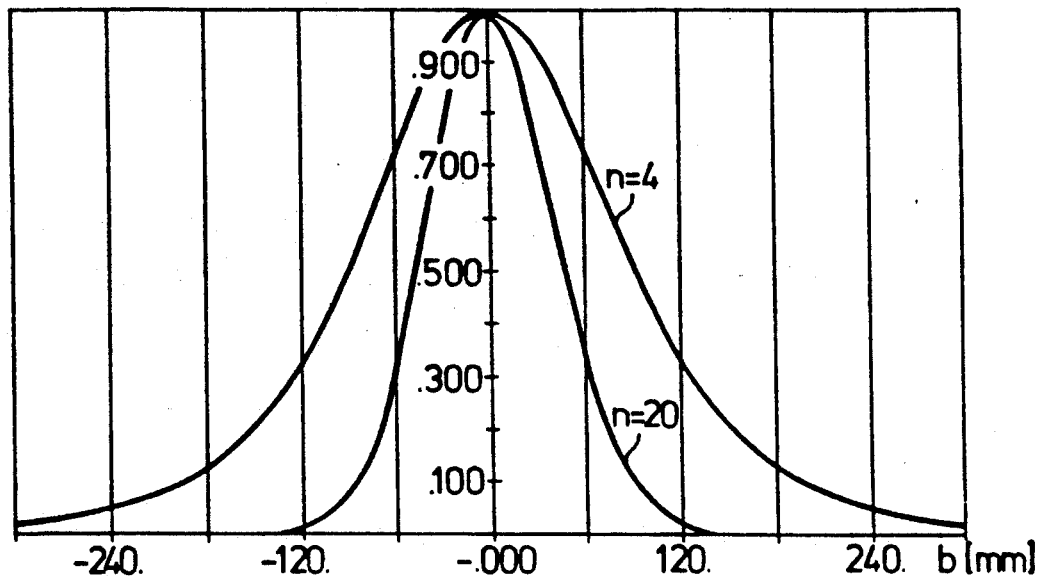
FIG. 3 is a graph comparing the distribution of layer thicknesses for a vessel arrangement as a separate individual source and as combined individual sources.
FIG. 4 is a table showing the minimal deviations in layer thickness and the efficiency loss when the individual sources are offset.

FIG. 3 is a graph showing the distribution of the layer thickness on a coated band substrate. The distribution curves follow a cosine function with exponent n wherein $n=4$ for a separate individual source and $n=20$ for an individual source in combination with others.

Independent of the absolute thickness of the layer to be applied, the parabolic distribution curves have their maximum at a distance $b=0$ mm perpendicular to the longitudinal axes L, L', ... of the evaporator vessel 1, 1', ... i.e. the maximum is on the longitudinal axis L, L', ..

The distribution curves for the separate individual source with $n=4$ approaches the ordinate b at approximately $\pm 300$ mm whereas the curve for the individual source in a combination of evaporator vessels 1, 1', ... with $n=20$ follows an obviously steeper course and approaches the ordinate b already at approximately $\pm 120$ mm.

The table of FIG. 4 gives the deviations of the layer thickness $$\frac{d_{max} - d_{min}}{d} (\%)$$

as function of a (a being the distance between the transverse axes 3, 3' of the individual evaporator vessels 1, 1', ... and the center line 4 of the row of evaporators) and also gives the efficiency loss ($\eta_o - \eta$) (%).

$\eta$ designates the general efficiency determined by the ratio of the amount of molecules deposited on the substrate to the amount of molecules released by the evaporator vessel, and $\eta_o$ is the efficiency for $a=0$. Under these conditions and with a constant evaporation rate of approximately 6 g/min, a deviation in the layer thickness of 6-8% without efficiency loss was determined for $a=0$, i.e. a parallel vessel arrangement as used in the prior art. For $a=20$ mm, there was a reduced deviation in the layer thickness of 2-3% with an efficiency loss of 2%. For a distance $a=30$ mm, there was a layer thickness deviation of smaller/equal to 1% with the efficiency loss already amounting to 4%.

This efficiency loss, however, can be compensated by a correspondingly increased deposition rate or by modifying the geometry of the shielding surfaces.

In the alternative embodiment of FIG. 5, rectangular evaporation cells 1, 1', ... have likewise rectangular indentations on their surfaces, which are referred to hereinafter as cavities K, K', ... At their ends the cells 1, 1', ... are held by virtually circular jaws 2,2', ... and are so arranged that their longitudinal axes L, L', ... are parallel and at a fixed distance X apart. The transverse axes of the individual evaporating cells 1, 1', ... coincide with the common center line 3 of all cells 1, 1', ... and thus that of the entire evaporator bank 4. The band to be coated can move above the evaporator bank in the direction A perpendicular to the center line 3 of the latter.

The cavities K, K', ... of the evaporating cells 1, 1', ... are offset alternately with their transverse axes by the distance "a" from the center line 3 of the evaporator bank, but all cavities K, K', ... cover a narrow coating zone B represented cross-hatched, which extends transversely of the direction of band movement A.

The cavities of first alternate vessels have a first common centerline extending transversely of the longitudinal axes of the vessels and offset from the centerline 3 of the evaporator bank by distance "a". The cavities of second alternate vessels lying intermediate the first alternate vessels have a second common centerline offset to the other side of the centerline 3 by a distance "a", whereby the common centerlines are offset from each other by a distance 2a.

Figure 5:
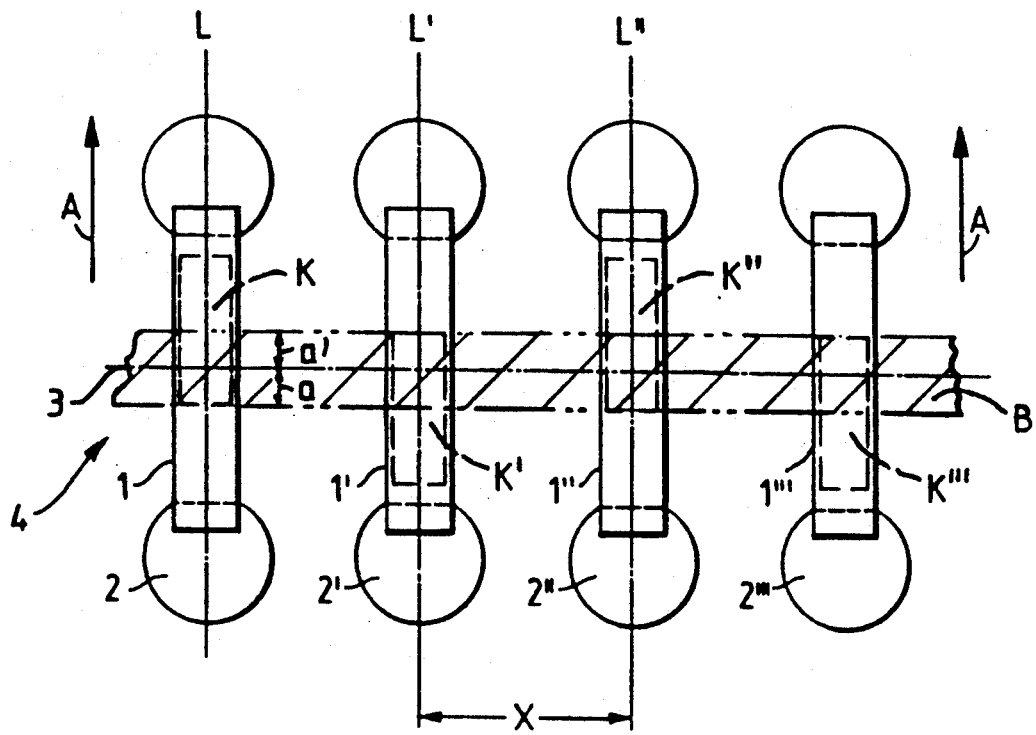
FIG. 5 is a diagrammatic plan view of evaporator vessels having offset cavities in accordance with a second embodiment of the invention.

In FIG. 5 the zone B has a width 2a equal to half the length of a cavity, which represents a preferred width. The minimum width of zone B corresponds to zero cavity overlap, i.e. the centerlines of the cavities are offset from the centerline of the evaporator bank by a distance "a" which equals half the length of a cavity.

We claim:

1. Apparatus for the continuous coating of a band-shaped substrate having a direction of movement in a vacuum coating chamber, said apparatus comprising a row of elongate evaporation vessels of electrically conductive ceramic material, said vessels having longitudinal axes and like lengths measured along said axes, said axes being parallel to the direction of movement and spaced a like distance apart, each vessel having therein an elongate cavity parallel to the axis of the vessel, the cavities of first alternate vessels having a first common centerline extending transversely of said direction of movement, the cavities of second alternate vessels lying intermediate said first alternate vessels and having a second common centerline parallel to and spaced from said first common centerline, the cavities of the first and second alternate vessels together overlapping an area extending transversely of the direction of movement of the substrate, which area defines a coating zone having a width parallel to said direction of movement.

2. Apparatus as in claim 1 wherein the width of the coating zone is less than half the length of a cavity.

3. Apparatus as in claim 1 wherein the distance between axes is two-thirds the length of a vessel.

4. Apparatus as in claim 1 further comprising individually controllable power supply means for each vessel.

5. Apparatus as in claim 1 further comprising means for continuously supplying wire to be evaporated to the evaporation vessels.

6. Apparatus as in claim 1 wherein the cavities are centered longitudinally in the respective vessels, whereby the vessels have transverse centerlines which coincide with the centerlines of the cavities.

7. Apparatus as in claim 1 wherein said vessels have a common center line transverse to their axes, the center lines of the cavities of the first alternate vessels being offset to one side of the common center line of the vessels, the center lines of the cavities of the second alternate vessels being offset to the other side of the common center line of the vessels.

8. Apparatus as in claim 1 wherein each evaporator vessel has a surface area and each cavity has a bottom surface area, the ratio of the bottom surface area of the cavity to the surface area of the vessel being 1:2.

9. Apparatus as in claim 1 wherein the cavities have a length parallel to the direction of movement and the coating zone has a width parallel to the direction of movement, the width of the coating zone ranging from zero to half the length of a cavity.

* * * * *